US010483392B2

(12) United States Patent
Vedula

(10) Patent No.: US 10,483,392 B2
(45) Date of Patent: Nov. 19, 2019

(54) CAPACITIVE TUNING USING BACKSIDE GATE

(71) Applicant: QUALCOMM Incorporated, San Diego, CA (US)

(72) Inventor: Ravi Pramod Kumar Vedula, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/988,987

(22) Filed: May 24, 2018

(65) Prior Publication Data
US 2019/0189801 A1 Jun. 20, 2019

Related U.S. Application Data

(60) Provisional application No. 62/599,519, filed on Dec. 15, 2017.

(51) Int. Cl.
*H01L 29/78* (2006.01)
*H01L 21/683* (2006.01)
*H01L 21/84* (2006.01)
*H01L 23/522* (2006.01)
(Continued)

(52) U.S. Cl.
CPC ...... *H01L 29/7831* (2013.01); *H01L 21/6835* (2013.01); *H01L 21/84* (2013.01);
(Continued)

(58) Field of Classification Search
CPC ............... H01L 29/7831; H01L 29/649; H01L 29/42376; H01L 29/66484; H01L 23/5226;
(Continued)

(56) References Cited

U.S. PATENT DOCUMENTS 7,098,755 B2      8/2006  Zhao et al.
7,838,367 B2 *   11/2010  Ponomarev ....... H01L 29/78648
                                                              438/283
(Continued)

FOREIGN PATENT DOCUMENTS

JP          H0786596 A       3/1995
WO          2006028195 A1    3/2006
WO          2016183146 A1   11/2016

OTHER PUBLICATIONS

Vaddi et al. "Design and Analysis of Double-Gate MOSFETs for Ultra-Low Power Radio Frequency Identification (RFID): Device and Circuit Co-Design," J. Low Power Electron. Appl. 2011, 1, 277-302. (Year: 2011).*

(Continued)

Primary Examiner — Matthew L Reames
(74) Attorney, Agent, or Firm — Qualcomm Incorporate/Seyfarth Shaw LLP

(57) ABSTRACT

A radio frequency (RF) integrated circuit (RFIC) switch multi-finger transistor includes a first dual gate transistor having a first gate with a first gate length on a first side of a substrate, and a second gate with a second gate length on a second side of the substrate. The RFIC also includes a second dual gate transistor having a third gate with a third gate length on the first side of the substrate, and a fourth gate with a fourth gate length on the second side of the substrate. The second gate length is different than the fourth gate length, and the second dual gate transistor is coupled in series with the first dual gate transistor in the RFIC switch multi-finger transistor.

20 Claims, 10 Drawing Sheets

(51) Int. Cl.
*H01L 23/528* (2006.01)
*H01L 23/66* (2006.01)
*H01L 27/12* (2006.01)
*H01L 29/06* (2006.01)
*H01L 29/423* (2006.01)
*H01L 29/66* (2006.01)

(52) U.S. Cl.
CPC ........ *H01L 23/528* (2013.01); *H01L 23/5226* (2013.01); *H01L 23/66* (2013.01); *H01L 27/1203* (2013.01); *H01L 29/0649* (2013.01); *H01L 29/42376* (2013.01); *H01L 29/66484* (2013.01); *H01L 2221/6835* (2013.01); *H01L 2221/68363* (2013.01); *H01L 2223/6677* (2013.01)

(58) Field of Classification Search
CPC ... H01L 23/528; H01L 23/66; H01L 21/6835; H01L 21/84
See application file for complete search history.

(56) References Cited

U.S. PATENT DOCUMENTS

| | | |
|---|---|---|
| 8,401,496 B2 | 3/2013 | Goto et al. |
| 9,595,956 B2 | 3/2017 | Englekirk et al. |
| 9,620,424 B2 | 4/2017 | Blin et al. |
| 2010/0096667 A1 | 4/2010 | Nakajima et al. |
| 2012/0112832 A1 | 5/2012 | Kawano et al. |
| 2014/0342529 A1 | 11/2014 | Goktepeli et al. |
| 2015/0303982 A1 | 10/2015 | Yang et al. |

OTHER PUBLICATIONS

International Search Report and Written Opinion—PCT/US2018/057384—ISA/EPO—dated Feb. 25, 2019.

* cited by examiner

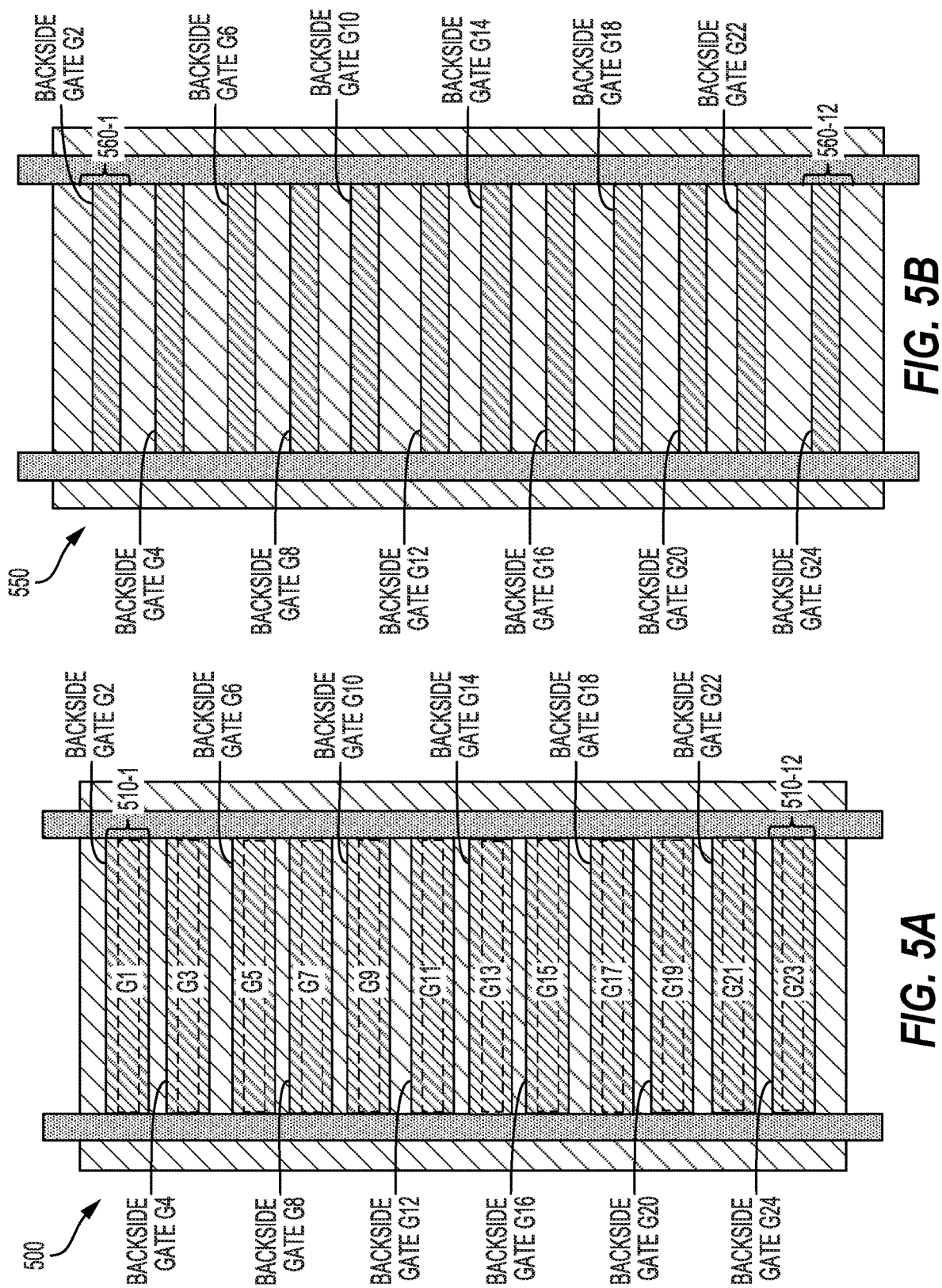

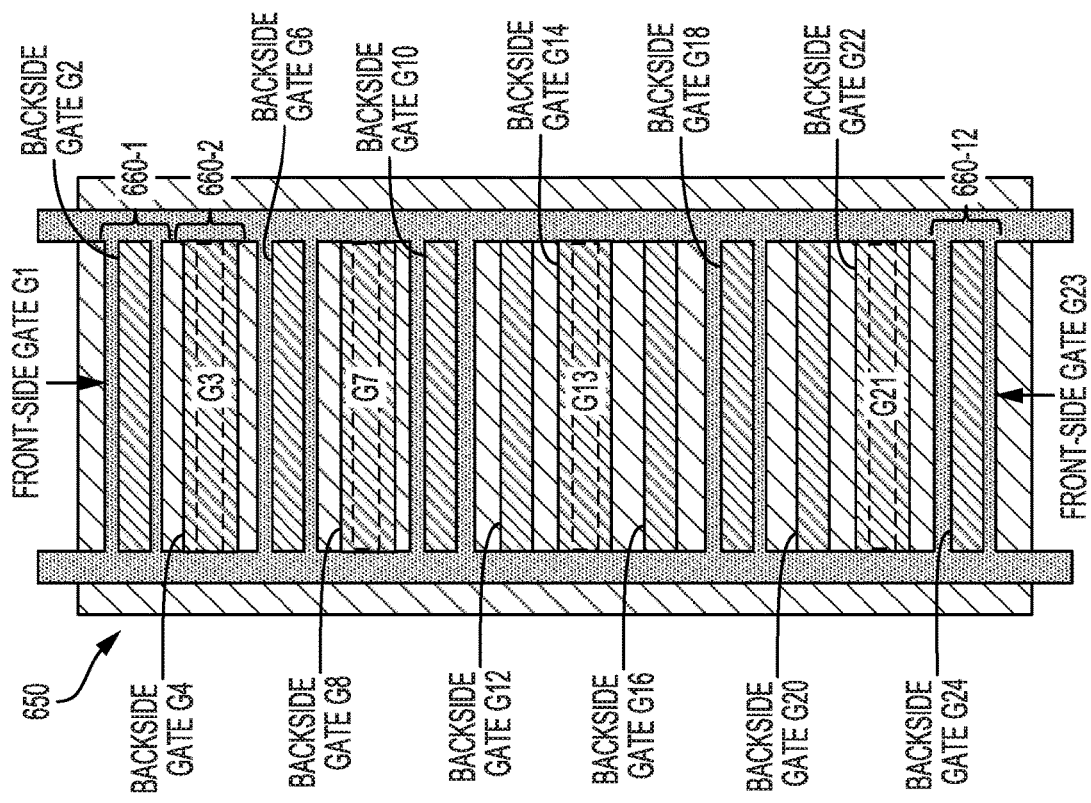
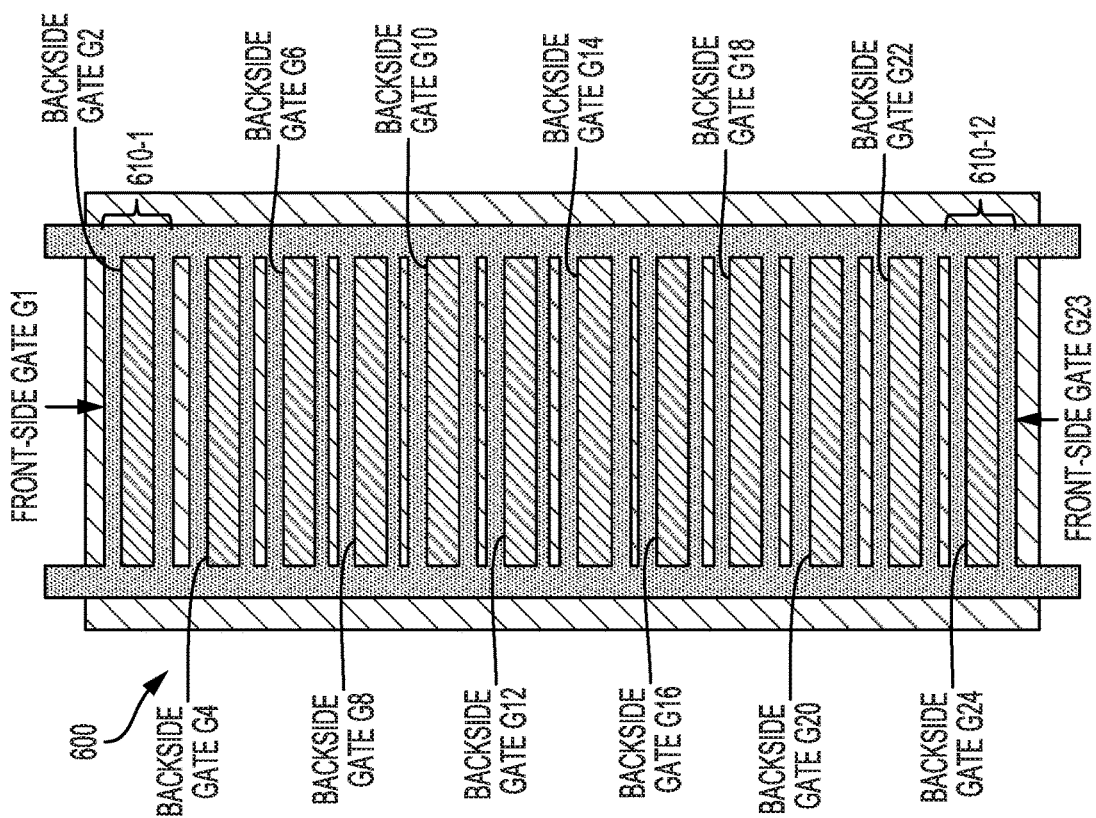
FIG. 6B
FIG. 6A

CAPACITIVE TUNING USING BACKSIDE GATE

CROSS-REFERENCE TO RELATED APPLICATION

This application claims the benefit of U.S. Provisional Patent Application No. 62/599,519, filed on Dec. 15, 2017, entitled "CAPACITIVE TUNING USING BACKSIDE GATE," the disclosure of which is expressly incorporated by reference herein in its entirety.

TECHNICAL FIELD

The present disclosure generally relates to integrated circuits (ICs). More specifically, the present disclosure relates to a radio frequency (RF) integrated circuit (RFIC) switch stack layout with capacitive tuning using a backside gate.

BACKGROUND

Designing mobile radio frequency (RF) chips (e.g., mobile RF transceivers) is complicated by added circuit functions for support of communication enhancements. These mobile RF transceivers may be designed using semiconductor on insulator technology. Semiconductor on insulator (SOI) technology replaces conventional semiconductor (e.g., silicon) substrates (e.g., wafers) with a layered semiconductor-insulator-semiconductor substrate for reducing parasitic device capacitance and improving performance. In SOI devices, an active device is fabricated using an SOI layer, in which an SOI semiconductor substrate supports a buried oxide (BOX) layer as the insulator.

The active devices on the SOI layer may include complementary metal oxide semiconductor (CMOS) transistors. RF switch devices of mobile RF transceivers may be fabricated using CMOS transistors on SOI substrates. Unfortunately, successful fabrication of RF switch transistors using SOI technology is complicated by parasitic capacitance. For example, one criteria for rating the performance of an RF switch transistor is an off-state capacitance (Coff), in which the RF switch transistor is modeled as a capacitor during an off-state. The larger the off-state capacitance Coff, the larger the off-state leakage of the RF switch transistor and corresponding lower performance rating.

An RF switch may include a stack of RF switch transistors that are coupled in series for achieving a desired power handling capability, in which each transistor exhibits a predetermined breakdown voltage. Stacking of switch transistors for achieving the desired power handling capability (e.g., desired breakdown voltage) beneficially reduces the off-state capacitance Coff. Unfortunately, a desired breakdown voltage, as well as the off-state capacitance Coff scaling, begins saturating after a certain stack height, which may be due to parasitic capacitive coupling to the ground lines and/or the substrate. One technique for overcoming this problem is tuning the capacitance by increasing/decreasing (e.g., 10%-20%) the capacitance of each transistor in the stack, which leads to a uniform overall capacitance. A further increase in the capacitance is desirable for providing more uniform scaling.

SUMMARY

A radio frequency (RF) integrated circuit (RFIC) switch multi-finger transistor includes a first dual gate transistor having a first gate with a first gate length on a first side of a substrate, and a second gate with a second gate length on a second side of the substrate. The RFIC also includes a second dual gate transistor having a third gate with a third gate length on the first side of the substrate, and a fourth gate with a fourth gate length on the second side of the substrate. The second gate length is different than the fourth gate length, and the second dual gate transistor is coupled in series with the first dual gate transistor in the RFIC switch multi-finger transistor.

A method of constructing a radio frequency (RF) integrated circuit (RFIC) switch multi-finger transistor may include fabricating a first dual gate transistor having a first gate with a first gate length on a first side of a substrate supported by a sacrificial substrate. The RFIC may also include fabricating a second dual gate transistor having a third gate with a third gate length on the first side of the substrate and adjacent to the first dual gate transistor. The RFIC may also include depositing a first side dielectric layer on the first dual gate transistor and the second dual gate transistor. The RFIC may also include bonding a handle substrate to the first side dielectric layer. The RFIC may also include removing the sacrificial substrate. The RFIC may also include fabricating a second gate, with a second gate length, of the first dual gate transistor on a second side opposite the first side of the substrate and overlapping with the first gate. The RFIC may further include fabricating a fourth gate, with a fourth gate length, of the second dual gate transistor on the second side of the substrate and overlapping with the third gate, in which the second gate length is different than the fourth gate length.

A radio frequency (RF) front end module may include an RF integrated circuit (RFIC) switch multi-finger transistor comprising a first dual gate transistor having a first gate with a first gate length on a first side of a substrate, and a second gate with a second gate length on a second side of the substrate, and a second dual gate transistor having a third gate with a third gate length on the first side of the substrate, and a fourth gate with a fourth gate length on the second side of the substrate, in which the second gate length is different than the fourth gate length, and the second dual gate transistor is coupled in series with the first dual gate transistor in the RFIC switch multi-finger transistor. The RFIC front end module may also include an antenna coupled to the RFIC switch multi-finger transistor.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A and 5B are backside views of radio frequency (RF) integrated circuit switch multi-finger transistor layouts with capacitance tuning using a backside gate, according to aspects of the present disclosure.

FIGS. 6A and 6B are backside views of radio frequency (RF) integrated circuit switch multi-finger transistor layouts with capacitance tuning using front-side gates and backside gates, according to aspects of the present disclosure.

DETAILED DESCRIPTION

Figure 1:
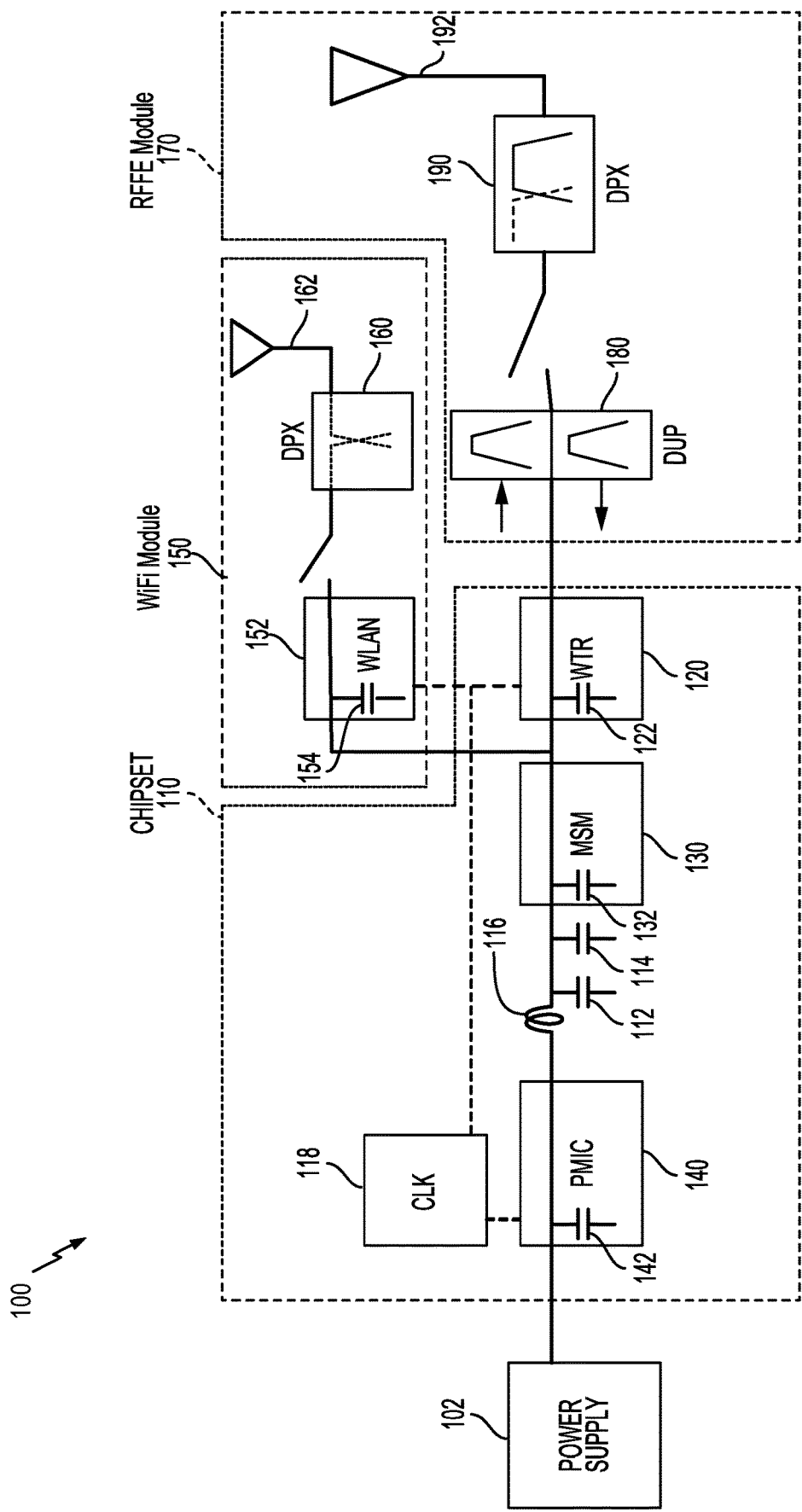
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Designing mobile radio frequency (RF) chips (e.g., mobile RF transceivers) is complicated by added circuit functions for supporting communication enhancements. These mobile RF transceivers may be designed using semiconductor on insulator technology. Semiconductor on insulator (SOI) technology replaces conventional silicon substrates with a layered semiconductor-insulator-semiconductor substrate for reducing parasitic device capacitance and improving performance. In SOI devices, an active device is fabricated using an SOI layer, in which an SOI substrate includes a buried oxide (BOX) layer as the insulator.

The active devices on the SOI layer may include high performance complementary metal oxide semiconductor (CMOS) transistors. RF switch devices of mobile RF transceivers may be fabricated using CMOS transistors on SOI substrates. An RF front end (RFFE) module may rely on these high performance CMOS RF switch transistors for successful operation. Unfortunately, successful fabrication of RF switch transistors using SOI technology is complicated by parasitic capacitance. For example, one criteria for rating the performance of an RF switch transistor is an off-state capacitance (Coff), in which the RF switch transistor is modeled as a capacitor during an off-state. The larger the off-state capacitance Coff, the larger the off-state leakage of the RF switch transistor and corresponding lower performance rating.

An RF switch may include a stack of RF switch transistors that are coupled in series for achieving a desired power handling capability, in which each transistor exhibits a predetermined breakdown voltage. Stacking of switch transistors for achieving the desired power handling capability (e.g., desired breakdown voltage) beneficially reduces the off-state capacitance Coff. Unfortunately, a desired breakdown voltage as well as the off-state capacitance Coff begins saturating after a certain stack height, which may be due to parasitic capacitance coupling to the ground lines and/or the substrate. One technique for overcoming this problem is tuning the capacitance by increasing/decreasing (e.g., 10%-20%) the capacitance of each transistor in the stack which leads to a uniform overall capacitance. A further increase in the capacitance is desirable for providing more uniform scaling.

Various aspects of the present disclosure provide techniques for creating an RF integrated circuit (RFIC) switch stack layout with capacitive tuning using backside gates having varying gate lengths. The process flow for semiconductor fabrication of the RFIC switch stack may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

Aspects of the present disclosure use an RF layer transfer process for forming a stack of multi-finger transistors, in which gate lengths of front-side gates and/or backside gates are varied for tuning capacitance. An RFIC switch multi-finger transistor includes a first dual gate transistor having a first gate with a first gate length on a first side of a substrate, and a second gate with a second gate length on a second side of the substrate. A second dual gate transistor has a third gate with a third gate length on the first side of the substrate, and a fourth gate with a fourth gate length on the second side of the substrate. The second gate length is different than the fourth gate length, and the second dual gate transistor is coupled in series with the first dual gate transistor in the RFIC switch multi-finger transistor. In this arrangement, the second gate overlaps with a channel region and/or a source region and/or a drain region of the first dual gate transistor more than the fourth gate overlaps with a channel region and/or a source region and/or a drain region of the second dual gate transistor. The terms first side and second side may be used interchangeably to refer to a front-side or a backside of an SOI substrate.

FIG. 1 is a schematic diagram of a wireless device 100 (e.g., a cellular phone or a smartphone) having an RFIC switch stack with varying backside gate lengths, according to aspects of the present disclosure. The wireless device 100 may include a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to a wireless transceiver 120 (WTR) through a duplexer 180 (DUP). The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device 100 generally includes a mobile RF transceiver to transmit and receive data for two-way communication. A mobile RF transceiver may include a transmit section for transmitting data and a receive section for receiving data. For transmitting data, the transmit section modulate an RF carrier signal with data for obtaining a modulated RF signal, amplifying the modulated RF signal using a power amplifier (PA) for obtaining an amplified RF signal having the proper output power level, and transmitting the amplified RF signal via the antenna 192 to a base station. For receiving data, the receive section may obtain a received RF signal via the antenna 192, in which the received RF signal is amplified using a low noise amplifier (LNA) and processed for recovering data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

In FIG. 1, the wireless transceiver 120 and the RF front end module 170 may be implemented using semiconductor on insulator (SOI) technology for fabricating transistors of the wireless transceiver 120 and the RF front end module 170, which helps reduce high order harmonics in the RF front end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness of the BOX layer in sub-micron process nodes, however, may not sufficiently reduce the parasitic capacitance caused by the proximity of an active device on the SOI layer and a semiconductor substrate supporting the BOX layer. As a result, a layer transfer process to further separate the active device from the substrate can be introduced, as shown in FIGS. 2A to 2D.

Figure 2A:
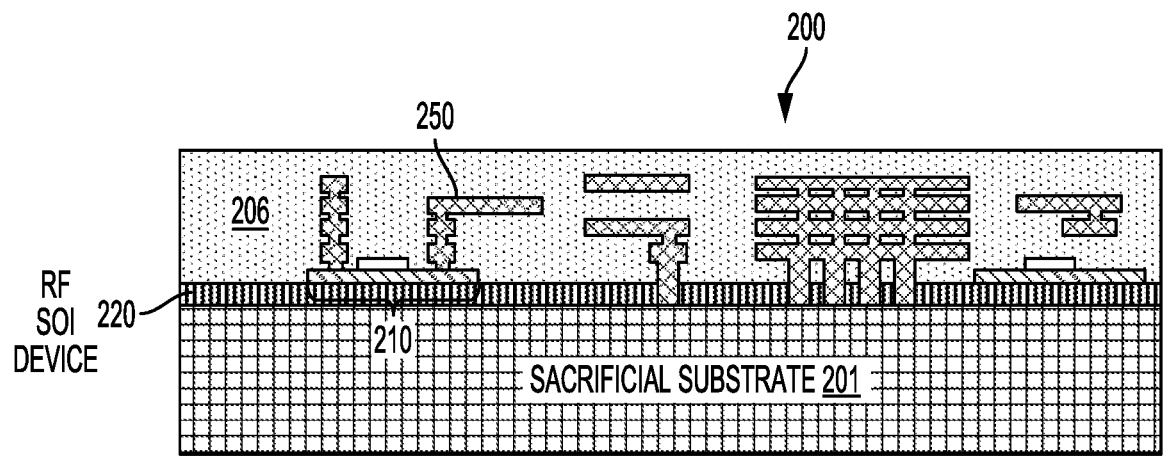
FIGS. 2A to 2D show cross-sectional views of a radio frequency (RF) integrated circuit during a layer transfer process, according to aspects of the present disclosure.
Figure 2B:
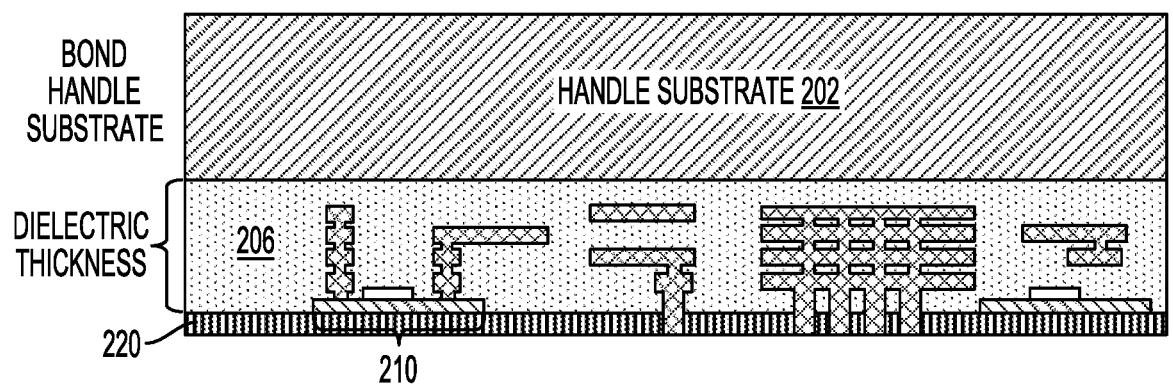

FIGS. 2A to 2D show cross-sectional views of a radio frequency (RF) integrated circuit 200 during a layer transfer process, according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a first dielectric layer 206. As shown in FIG. 2B, a handle substrate 202 is bonded to the first dielectric layer 206 of the RF SOI device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is proportional to the dielectric thickness, which determines the distance between the active device 210 and the handle substrate 202.

Figure 2C:
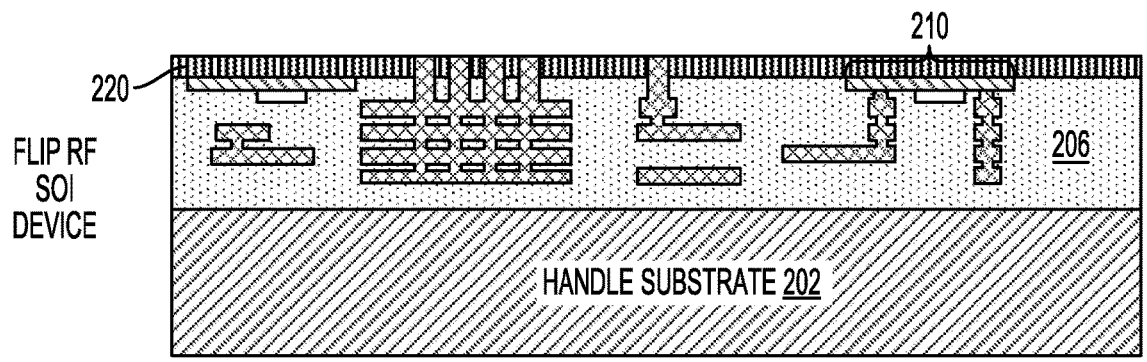
Figure 2D:
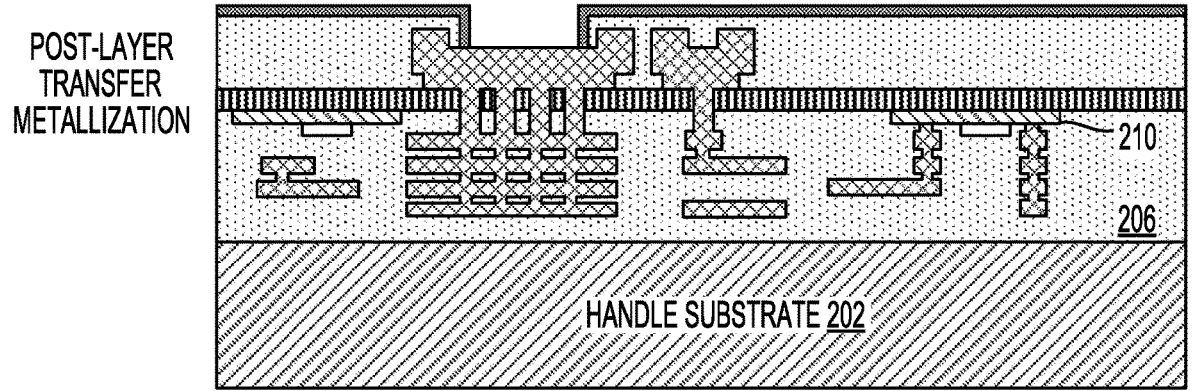

As shown in FIG. 2C, the RF SOI device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

The active device 210 on the BOX layer 220 may be a complementary metal oxide semiconductor (CMOS) transistor. Unfortunately, successful fabrication of CMOS transistors using SOI technology is complicated by parasitic capacitance. For example, one criteria for rating the performance of an RF switch transistor is an off-state capacitance (Coff), in which the RF switch transistor is modeled as a capacitor during an off-state. The larger the off-state capacitance Coff, the larger the off-state leakage of the RF switch transistor and corresponding lower performance rating. This additional capacitance causes adverse effects, such as circuit delays and losses that are especially problematic for an RFIC switch stack, in which a stack of RF switch transistors are coupled in series for achieving a desired power handling capability.

Figure 3:
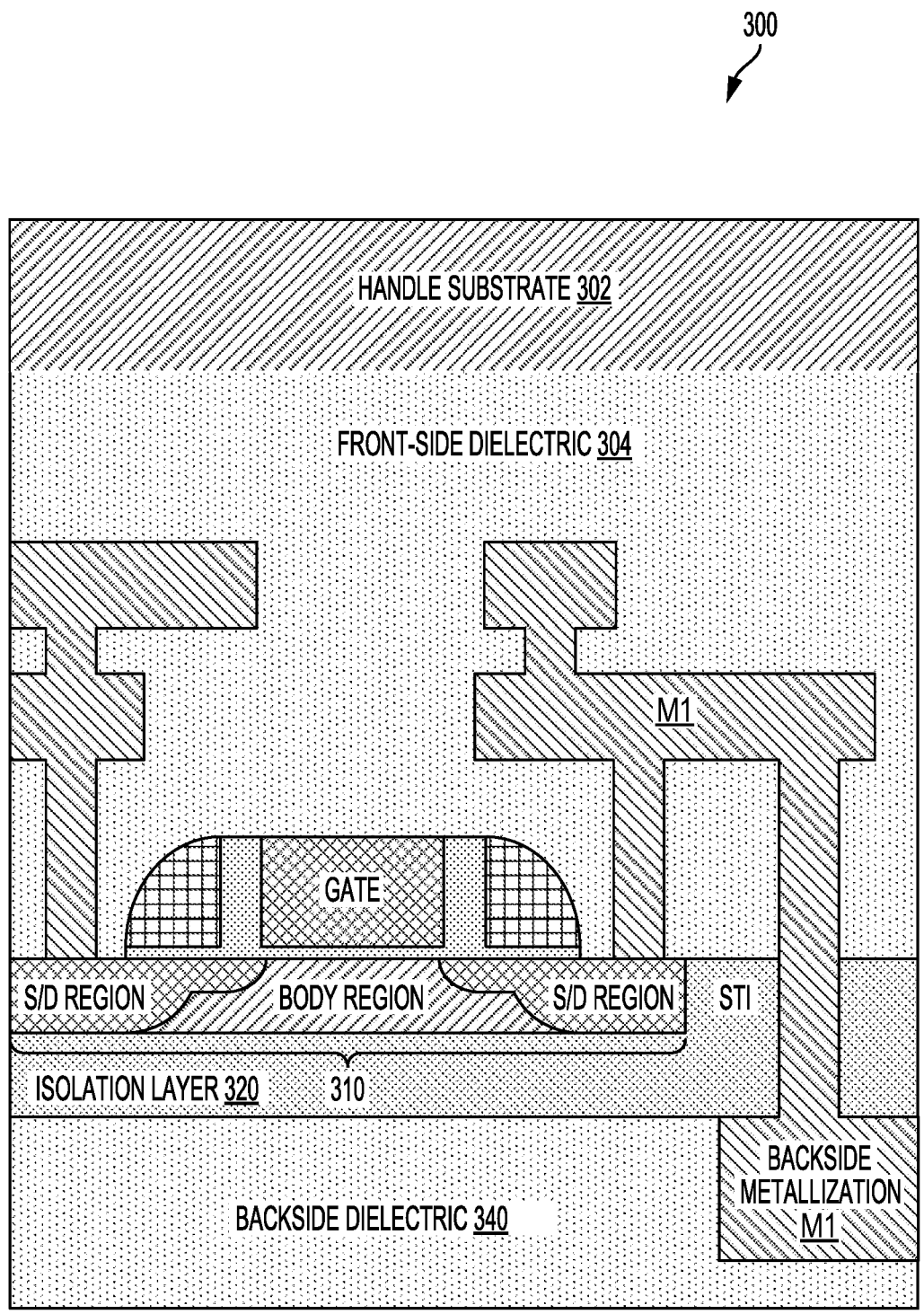
FIG. 3 is a cross-sectional view of a radio frequency (RF) integrated circuit fabricated using a layer transfer process, according to aspects of the present disclosure.

FIG. 3 is a cross-sectional view of an RF integrated circuit 300, including an RF switch transistor fabricated using a layer transfer process. Representatively, the RF integrated circuit 300 includes an RF switch transistor 310 having a gate, a body, and source/drain (S/D) regions formed on an isolation layer 320. In SOI implementations, the isolation layer 320 is a buried oxide (BOX) layer, and the body and source/drain regions are formed from an SOI layer (e.g., silicon) including shallow trench isolation (STI) regions supported by the isolation layer 320. A body contact may be tied to the gate of the RF switch transistor 310 for an RF switch device configuration. The RF switch transistor 310 may be configured as a four terminal device for the RF switch device configuration.

The RF integrated circuit 300 also includes middle-of-line (MOL) interconnects and back-end-of-line (BEOL) interconnects (e.g., M1) coupled to the source/drain regions of the RF switch transistor 310. As described herein, the MOL/BEOL layers are referred to as front-side layers. By contrast, the layers supporting the isolation layer 320 may be referred to as backside layers. According to this nomenclature, a front-side metallization M1 is coupled to the source region and drain region of the RF switch transistor 310 and arranged in a front-side dielectric layer 304 (e.g., a first-side dielectric layer) to which a handle substrate 302 is coupled. In this example, a backside dielectric 340 is adjacent to and possibly supports the isolation layer 320. A backside metallization M1 is coupled to the front-side metallization M1. The front-side metallization M1 is a front-side back-end-of-line (BEOL) interconnect (e.g., a first-side back-end-of-line (BEOL) interconnect) and the backside metallization M1 is a backside BEOL interconnect (e.g., a second-side BEOL interconnect).

An RF switch may include a stack of the RF switch transistor 310, coupled in series for achieving a desired power handling capability, in which each RF switch transistor exhibits a predetermined breakdown voltage. Stacking of RF switch transistors for achieving the desired power handling capability (e.g., desired breakdown voltage) beneficially reduces an off-state capacitance Coff. Various aspects of the present disclosure provide techniques for fabricating a radio frequency (RF) integrated circuit (RFIC) switch multi-finger transistor with capacitive tuning using varying backside gate lengths, as shown in FIGS. 4-6B.

Figure 4:
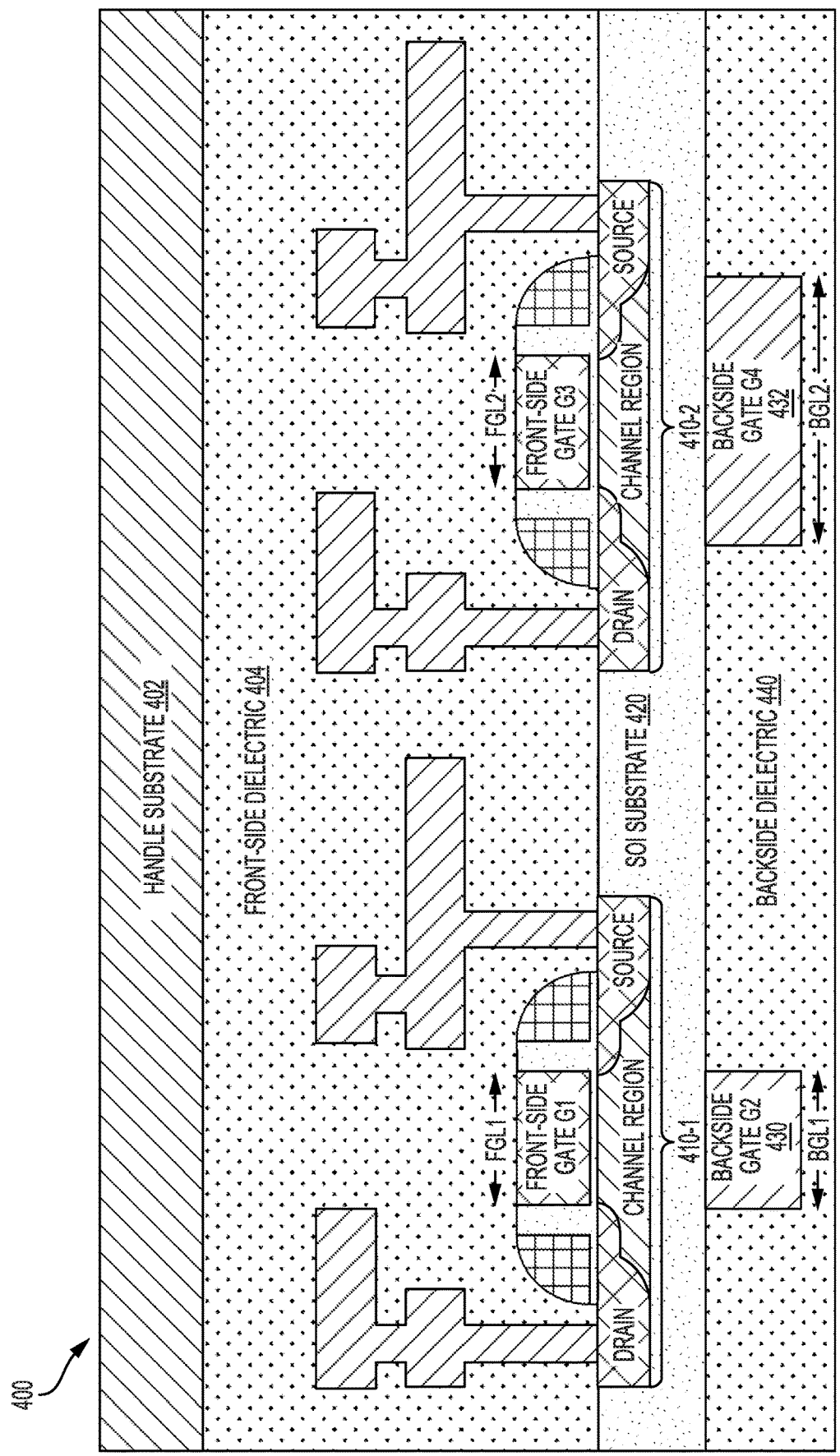
FIG. 4 is a cross-sectional view of a radio frequency (RF) integrated circuit switch multi-finger transistor layout with capacitance tuning using a backside gate, according to aspects of the present disclosure.

FIG. 4 is a cross-sectional view of an RF integrated circuit (RFIC) switch multi-finger transistor 400 fabricated using a layer transfer (LT) process, according to aspects of the present disclosure. Representatively, the RFIC switch multi-finger transistor 400 includes a first dual gate transistor 410-1 having a front-side gate G1, a source region, a drain region, and a channel region between the source and drain regions. The front-side gate G1 is on a front-side of a substrate. In a semiconductor on insulator (SOI) implementation, an SOI substrate 420 includes a buried oxide (BOX) layer supporting an SOI layer (e.g., silicon), including the source, drain and channel regions of the first dual gate transistor 410-1. The SOI substrate 420 may be supported on a backside by a backside dielectric layer 440. The RFIC switch multi-finger transistor 400 also includes a second dual gate transistor 410-2 adjacent to the first dual gate transistor 410-1. The second dual gate transistor 410-2 also includes a front-side gate G3 on the front-side of the SOI substrate 420, as well as source, drain, and channel regions.

According to aspects of the present disclosure, the first dual gate transistor 410-1 includes a backside gate G2 (e.g., 430) on a backside of the SOI substrate 420 and overlapped with the front-side gate G1. This overlap may be defined according to a percentage of overlap or an absolute area overlap. In this example, the front-side gate G1 has a first front-side gate length (FGL1) that is different from a first backside gate length (BGL1) of the backside gate G2. In this example, the first front-side gate length FGL1 of the front-side gate G1 defines a channel length of the channel region of the first dual gate transistor 410-1. In addition, the first backside gate length (BGL1) defines a degree in which the backside gate G2 modifies electrical fields of the first dual gate transistor 410-1.

As further illustrated in FIG. 4, the second dual gate transistor 410-2 includes a backside gate G4 (e.g., 432) on the backside of the SOI substrate 420 and overlapped with the front-side gate G3. In this example, the front-side gate G3 has a second front-side gate length (FGL2) that is different from a second backside gate length (BGL2) of the backside gate G4. In addition, the first front-side gate length FGL1 is equal to the second front-side gate length FGL2, whereas the second backside gate length BGL2 is greater than the first backside gate length BGL1. Representatively, the backside gate G2 (second gate) overlaps with a channel region and/or a source region and/or a drain region of the first dual gate transistor 410-1 less than the backside gate G4 (fourth gate) overlaps with a channel region and/or a source region and/or a drain region of the second dual gate transistor 410-2 because the second backside gate length BGL2 is greater than the first backside gate length BGL1.

FIGS. 5A and 5B are backside views of radio frequency (RF) integrated circuit (RFIC) switch multi-finger transistor layouts with capacitance tuning using a backside gate, according to aspects of the present disclosure. Although described with reference to varying backside gate lengths, it should be recognized that the front-side gate length may also be varied for capacitive tuning of an RFIC switch stack.

As shown in FIG. 5A, an RFIC switch multi-finger transistor 500 includes dual gate transistors 510 (e.g., 510-1, ..., 510-12), in which front-side gates (e.g., front-side gate G1, ..., front-side gate G23) and backside gates (e.g., backside gate G2, ..., backside gate G24) have uniform gate lengths, according to aspects of the present disclosure. In this aspect of the present disclosure, a backside gate length of the backside gates is greater than a front-side gate length of the front-side gates. For example, as shown in FIG. 4, the second dual gate transistor 410-2 is fabricated to include the backside gate G4 having a backside gate length BGL2 greater than the front-side gate length FGL2 of the front-side gate G3 (e.g., BGL2>FGL2). Increasing the backside gate length BGL2 of the backside gate G4 enables dynamic tuning of the RFIC switch multi-finger transistor 500 for increasing capacitance (e.g., a 25% increase) and providing more uniform scaling of an off-state capacitance Coff.

As shown in FIG. 5B, an RFIC switch multi-finger transistor 550 includes dual gate transistors 560 (e.g., 560-1, ..., 560-12), in which front-side gates (not shown) and backside gates (e.g., backside gate G2, ..., backside gate G24) have uniform gate lengths, according to aspects of the present disclosure. In this aspect of the present disclosure, a backside gate length of the backside gates (e.g., backside gate G2) equals a front-side gate length of the front-side gates (e.g., front-side gate G1). Because the gate lengths are equal, the front-side gates are obscured by the backside gates when the RFIC switch multi-finger transistor 550 is viewed from the backside. For example, as shown in FIG. 4, the first dual gate transistor 410-1 is fabricated to include the backside gate G2 having a backside gate length BGL1 equal to the front-side gate length FGL1 of the front-side gate G1 (e.g., BGL1=FGL1). Matching the backside gate length BGL1 and the front-side gate length FGL1 enables dynamic tuning of the RFIC switch multi-finger transistor 550 for decreasing capacitance and adjusting the scaling of the off-state capacitance Coff. Combining such transistors in series to a form RF switch stack allows modulating and balancing of capacitances in the stack to achieve uniform power division across the stack of multi-finger transistors.

FIGS. 6A and 6B are backside views of radio frequency (RF) integrated circuit (RFIC) switch multi-finger transistor layouts with capacitance tuning using front-side gates and backside gates, according to aspects of the present disclosure.

As shown in FIG. 6A, an RFIC switch multi-finger transistor 600 includes dual gate transistors 610 (e.g., 610-1, ..., 610-12) in which front-side gates (e.g., front-side gate G1, ..., front-side gate G23) and backside gates (e.g., backside gate G2, ..., backside gate G24) have uniform gate lengths, according to aspects of the present disclosure. In this aspect of the present disclosure, a front-side gate length of the front-side gates (e.g., front-side gate G1) is greater than a backside gate length of the backside gates (e.g., backside gate G2). For example, in contrast to the second dual gate transistor 410-2 of FIG. 4, the dual gate transistors 610 are fabricated to include front-side gates (e.g., G1, ..., G23) having a front-side gate length greater than a backside gate length of the backside gates (e.g., G2, ..., G24). Increasing the front-side gate length of the front-side gates enables dynamic tuning of the RFIC switch multi-finger transistor 600 for increasing capacitance (e.g., a 25% increase) and providing more uniform scaling of an off-state capacitance Coff, when such transistors are connected in series to form an RFIC switch stack.

As shown in FIG. 6B, an RFIC switch multi-finger transistor 650 includes dual gate transistors 660 (e.g., 660-1, ..., 660-12), in which front-side gates (e.g., front-side gate G1, ..., front-side gate G23) and backside gates (e.g., backside gate G2, ..., backside gate G24) have non-uniform gate lengths, according to aspects of the present disclosure. In this aspect of the present disclosure, a backside gate length of the backside gates (e.g., backside gate G2) may be greater than, less than, or equal to a front-side gate length of the front-side gates (e.g., front-side gate G1). For example, a first dual gate transistor 610-1 is fabricated to include a front-side gate G1 having a front-side gate length greater than the backside gate length of the backside gate G2 (see FIG. 6A).

As further illustrated in FIG. 6B, a second dual gate transistor 660-2 is fabricated to include a front-side gate G3 having a front-side gate length less than the backside gate length of the backside gate G4 (see FIG. 5A). The RFIC switch multi-finger transistor 650 also includes dual gate transistors 660 having matching backside gate lengths and front-side gate lengths. According to aspects of the present disclosure, the RFIC switch multi-finger transistor 650 provides greater flexibility for dynamic tuning capacitance and adjusting the scaling of the off-state capacitance Coff.

Figure 7:
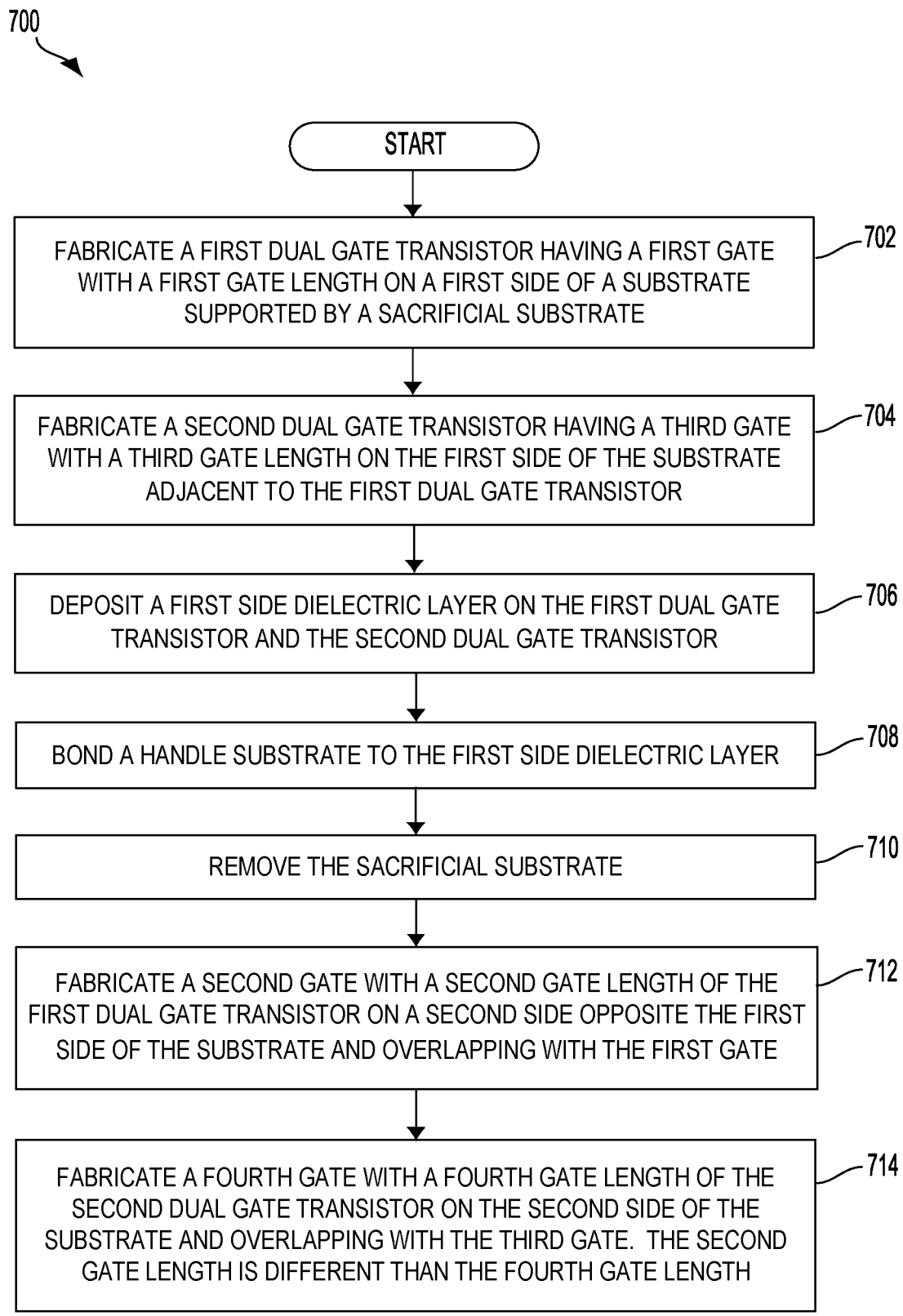
FIG. 7 is a process flow diagram illustrating a layer transfer process for constructing a radio frequency (RF) integrated circuit switch multi-finger transistor, according to an aspect of the present disclosure.

One aspect of the present disclosure uses a layer transfer (LT) process to form an RFIC switch stack with capacitive tuning using varying backside gate lengths, for example, as shown in FIG. 7. Although described with reference to varying backside gate lengths, it should be recognized that the front-side gate length may also be varied for capacitive tuning of an RFIC switch stack.

FIG. 7 is a process flow diagram 700 illustrating a method of constructing a radio frequency (RF) integrated circuit (RFIC) switch multi-finger transistor using an RF layer transfer (RFLT) process according to an aspect of the present disclosure. The method begins at block 702, in which a first dual gate transistor having a first gate with a first gate length is fabricated on a first side of a substrate supported by a sacrificial substrate. In block 704, a second dual gate transistor having a third gate with a third gate length is fabricated on the first side of the substrate adjacent to the first dual gate transistor. For example, as shown in FIG. 4, the first dual gate transistor 410-1 and the second dual gate transistor 410-2 are fabricated on the front-side of an SOI substrate 420.

In block 706, a first side dielectric layer is deposited on the first dual gate transistor and the second dual gate transistor. For example, as shown in FIG. 4, the front-side dielectric layer 404 is deposited on the first dual gate transistor 410-1 and the second dual gate transistor 410-2. In block 708, a handle substrate is bonded to the first side dielectric layer. For example, as shown in FIG. 4, the handle substrate 402 is bonded to the front-side dielectric layer 404. In block 710 of FIG. 7, the sacrificial substrate is removed. As shown in FIG. 2B, the layer-transfer process includes removal of the sacrificial substrate 201.

Referring again to FIG. 7, in block 712, a second gate with a second gate length of the first dual gate transistor is fabricated on a second side opposite the first side of the substrate and overlapped with the first gate. In block 714, a fourth gate with a fourth gate length of the second dual gate transistor is fabricated on the second side of the substrate and overlapping with the third gate. The second gate length is different than the fourth gate length. For example, as shown in FIG. 4, the first dual gate transistor 410-1 includes the backside gate 430 on a backside of the SOI substrate 420 as the second gate of the first dual gate transistor 410-1. Similarly, the second dual gate transistor 410-2 includes the second backside gate 432 on the backside of the SOI substrate 420 as the fourth gate of the second dual gate transistor 410-2. The method may further include coupling the RFIC switch multi-finger transistor in series with another RFIC switch multi-finger transistor to form an RFIC switch stack.

Aspects of the present disclosure may use dynamic backside gate overlap for tuning capacitance in an RF switch stack and enabling scaling of an off-state capacitance Coff. In this aspect of the present disclosure, a front-side gate defines a channel length and a backside gates modifies an electrical field of dual gate transistors in the RF switch stack. In one configuration, a first backside gate overlaps with a channel region and/or a source region and/or a drain region of a first dual gate transistor more than a second backside gate overlaps with a channel region and/or a source region and/or a drain region of a second dual gate transistor. The terms first side and second side may be used interchangeably to refer to a front-side or a backside of an RF switch stack. Although described with reference to varying backside gate lengths, it should be recognized that the front-side gate length may also be varied for supporting capacitive tuning of an RFIC switch stack.

According to a further aspect of the present disclosure, an RF integrated circuit (RFIC) switch multi-finger transistor, including varying length front-side and backside gates is described. The RFIC switch multi-finger transistor includes first and second dual gate transistors on a front-side surface of an SOI substrate, including a front-side dielectric layer on the first and second dual gate transistors. The RFIC switch multi-finger transistor also includes means for handling the RFIC switch multi-finger transistor on the front-side dielectric layer. The handling means may be the handle substrate, shown in FIG. 3. In another aspect, the aforementioned means may be any module, layer or any apparatus configured to perform the functions recited by the aforementioned means.

Figure 8:
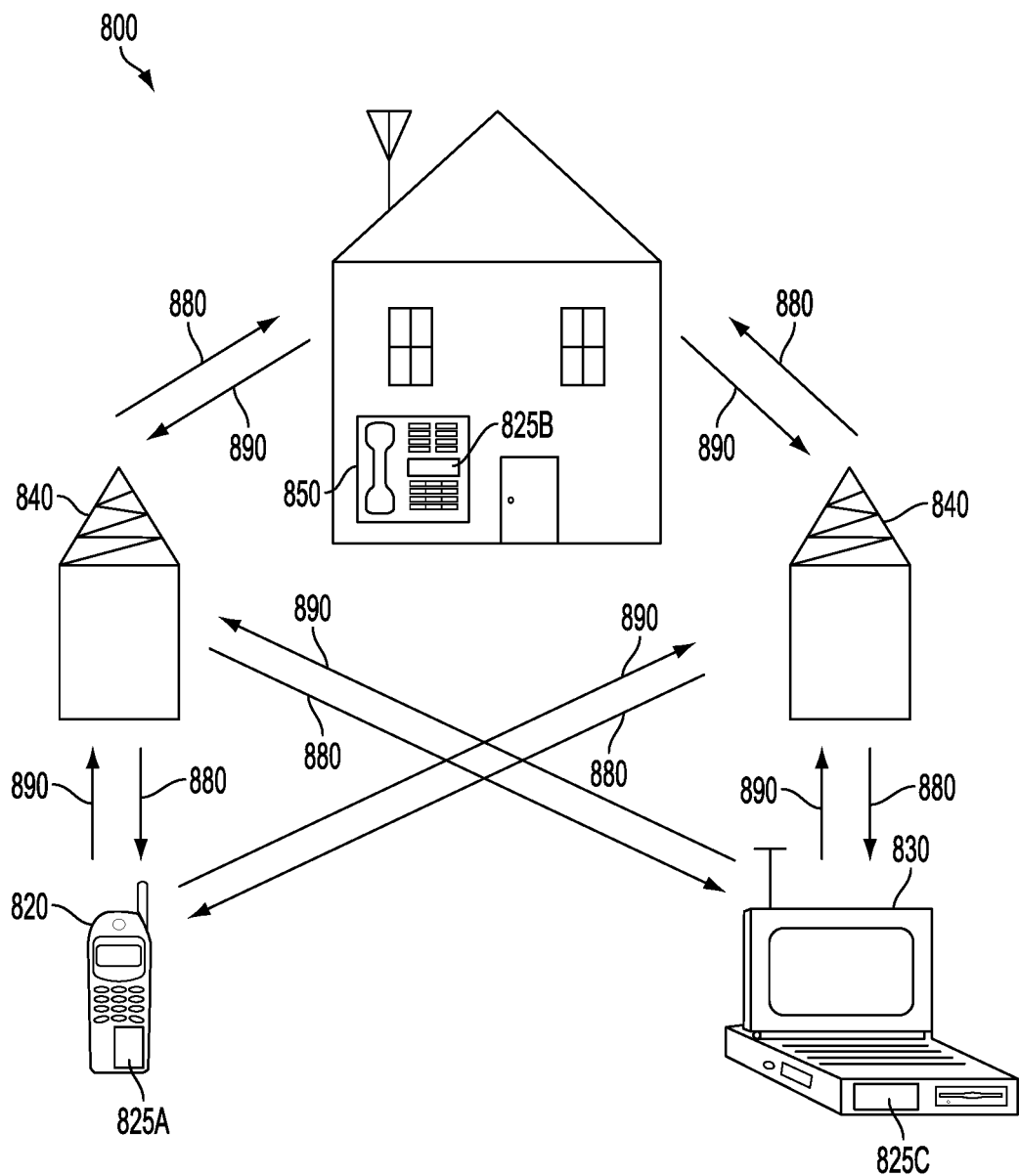
FIG. 8 is a block diagram showing an exemplary wireless communication system in which an aspect of the present disclosure may be advantageously employed.

FIG. 8 is a block diagram showing an exemplary wireless communication system 800 in which an aspect of the present disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed RFIC switch stack. It will be recognized that other devices may also include the disclosed RFIC switch stack, such as the base stations, switching devices, and network equipment. FIG. 8 shows forward link signals 880 from the base station 840 to the remote units 820, 830, and 850 and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed RFIC switch stack.

Figure 9:
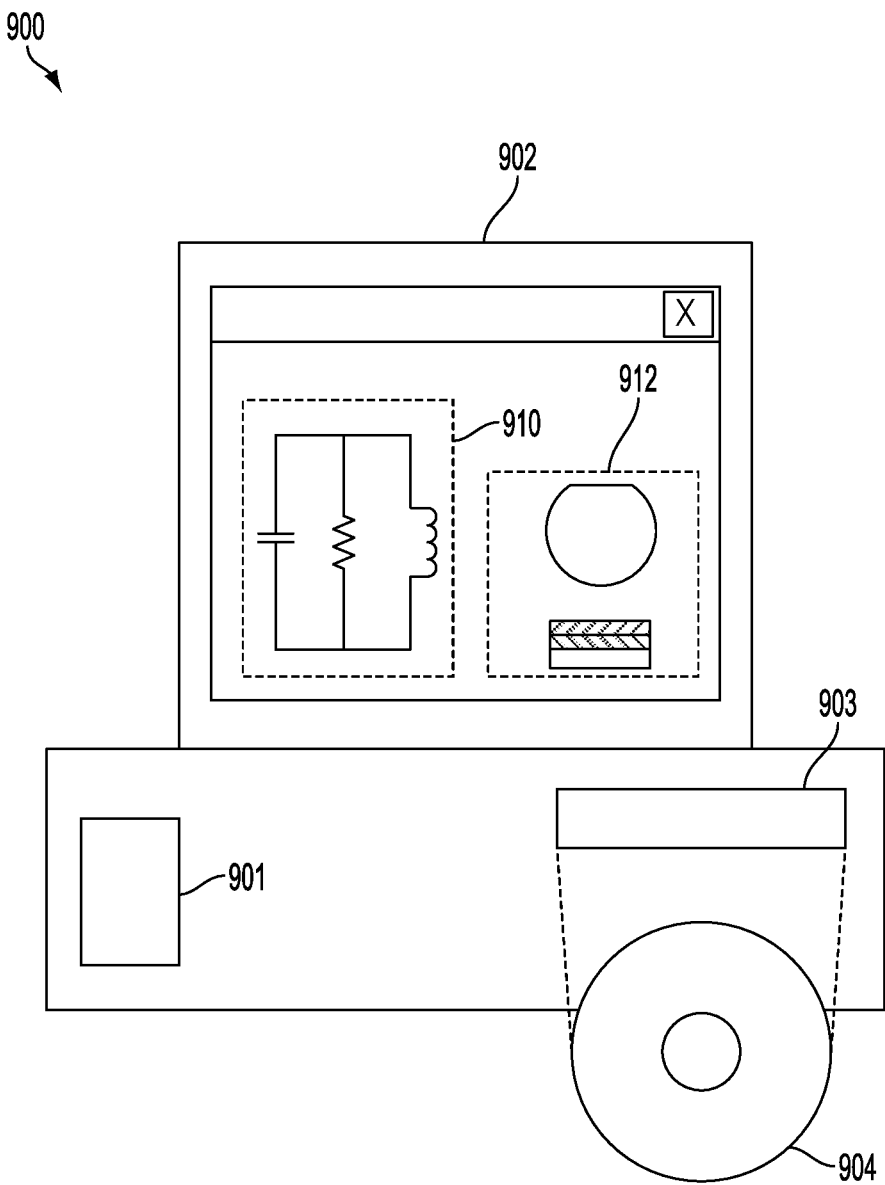
FIG. 9 is a block diagram illustrating a design workstation used for circuit, layout, and logic design of a semiconductor component, such as the RF devices disclosed above.

FIG. 9 is a block diagram illustrating a design workstation used for circuit, layout, and logic design of a semiconductor component, such as the RFIC switch stack disclosed above. A design workstation 900 includes a hard disk 901 containing operating system software, support files, and design software such as Cadence or OrCAD. The design workstation 900 also includes a display 902 to facilitate a circuit design 910 or an RFIC switch stack design 912. A storage medium 904 is provided for tangibly storing the circuit design 910 or the RFIC switch stack design 912. The circuit design 910 or the RFIC switch stack design 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the RFIC switch stack design 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A balanced radio frequency (RF) integrated circuit (RFIC) including a stack of switch multi-finger transistors, comprising:
    a first dual gate transistor having a first gate with a first gate length on a first side of a substrate, and a second gate with a second gate length on a second side of the substrate;
    a second dual gate transistor having a third gate with a third gate length on the first side of the substrate, and a fourth gate with a fourth gate length on the second side of the substrate, in which the second gate length is different than the fourth gate length, and the second dual gate transistor is coupled in series with the first dual gate transistor in the RFIC; and
    a dielectric layer on the second side of the substrate and in contact with the second gate and the fourth gate.

2. The RFIC including the stack of switch multi-finger transistors of claim 1, in which a percentage of overlap between the second gate and a channel region of the first dual gate transistor is less than a percentage of overlap between the fourth gate and a channel region of the second dual gate transistor.

3. The RFIC including the stack of switch multi-finger transistors of claim 1, in which the first side is a front-side of the substrate and the second side is a backside of the substrate.

4. The RFIC including the stack of switch multi-finger transistors of claim 1, in which the first gate length is equal to the third gate length.

5. The RFIC including the stack of switch multi-finger transistors of claim 1, in which the first gate length is different than the third gate length.

6. The RFIC including the stack of switch multi-finger transistors of claim 1, in which the first gate length is different than the second gate length.

7. The RFIC including the stack of switch multi-finger transistors of claim 1, in which the third gate length is different than the fourth gate length.

8. The RFIC including the stack of switch multi-finger transistors of claim 1, in which the substrate comprises a semiconductor on insulator (SOI) substrate, having an SOI layer as the first side of the substrate and an isolation layer as the second side of the substrate.

9. The RFIC including the stack of switch multi-finger transistors of claim 1, integrated into an RF front end module chip, the RF front end module chip incorporated into at least one of a music player, a video player, an entertainment unit, a navigation device, a communications device, a personal digital assistant (PDA), a fixed location data unit, a mobile phone, and a portable computer.

10. A method of constructing a balanced radio frequency (RF) integrated circuit (RFIC) including a stack of switch multi-finger transistors, comprising:
fabricating a first dual gate transistor having a first gate with a first gate length on a first side of a substrate supported by a sacrificial substrate;
fabricating a second dual gate transistor having a third gate with a third gate length on the first side of the substrate and adjacent to the first dual gate transistor;
depositing a first side dielectric layer on the first dual gate transistor and the second dual gate transistor;
bonding a handle substrate to the first side dielectric layer;
removing the sacrificial substrate;
fabricating a second gate, with a second gate length, of the first dual gate transistor on a second side opposite the first side of the substrate and overlapping with the first gate;
fabricating a fourth gate, with a fourth gate length, of the second dual gate transistor on the second side of the substrate and overlapping with the third gate, in which the second gate length is different than the fourth gate length; and
depositing a dielectric layer on the second side of the substrate and in contact with the second gate and the fourth gate.

11. The method of claim 10, in which the first side is a front-side of the substrate and the second side is a backside of the substrate.

12. The method of claim 10, in which the first gate length is equal to the third gate length.

13. The method of claim 10, in which the first gate length is different than the third gate length.

14. The method of claim 10, further comprising integrating the RFIC into an RF front end module, the RF front end module incorporated into at least one of a music player, a video player, an entertainment unit, a navigation device, a communications device, a personal digital assistant (PDA), a fixed location data unit, a mobile phone, and a portable computer.

15. A radio frequency (RF) front end module, comprising:
an RF integrated circuit (RFIC) including a stack of switch multi-finger transistors comprising a first dual gate transistor having a first gate with a first gate length on a first side of a substrate, and a second gate with a second gate length on a second side of the substrate, and a second dual gate transistor having a third gate with a third gate length on the first side of the substrate, a fourth gate with a fourth gate length on the second side of the substrate, in which the second gate length is different than the fourth gate length, and the second dual gate transistor is coupled in series with the first dual gate transistor in the RFIC switch multi-finger transistor, and a dielectric layer on the second side of the substrate and in contact with the second gate and the fourth gate; and
an antenna coupled to the RFIC.

16. The RF front end module of claim 15, in which the substrate comprises a semiconductor on insulator (SOI) substrate, having an SOI layer as the first side of the substrate and an isolation layer as the second side of the substrate.

17. The RF front end module of claim 15, in which the first gate length is equal to the third gate length.

18. The RF front end module of claim 15, in which the first gate length is different than the third gate length.

19. The RF front end module of claim 15, in which a percentage of overlap between the second gate and a channel region of the first dual gate transistor is less than a percentage of overlap between the fourth gate and a channel region of the second dual gate transistor.

20. The RF front end module of claim 15, integrated in a chip, incorporated into at least one of a music player, a video player, an entertainment unit, a navigation device, a communications device, a personal digital assistant (PDA), a fixed location data unit, a mobile phone, and a portable computer.

* * * * *